United States Patent
Yang et al.

(10) Patent No.: US 8,321,822 B2
(45) Date of Patent: Nov. 27, 2012

(54) METHOD AND COMPUTER-READABLE MEDIUM OF OPTICAL PROXIMITY CORRECTION

(75) Inventors: Yu-Shiang Yang, Madou Township, Tainan County (TW); Ming-Jui Chen, Tainan (TW); Te-Hung Wu, Xinshi Township, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 248 days.

(21) Appl. No.: 12/788,375

(22) Filed: May 27, 2010

(65) Prior Publication Data

US 2011/0296359 A1    Dec. 1, 2011

(51) Int. Cl.
*G06F 17/50*    (2006.01)
*G03F 1/00*    (2006.01)
*G03C 5/00*    (2006.01)

(52) U.S. Cl. .............. 716/54; 716/50; 716/51; 716/52; 716/53; 716/55; 716/56; 430/5; 430/30

(58) Field of Classification Search .............. 716/50–56; 430/5, 30
See application file for complete search history.

(56) References Cited

U.S. PATENT DOCUMENTS

| | | | |
|---|---|---|---|
| 7,191,428 B2 | 3/2007 | Tang et al. | |
| 7,245,356 B2* | 7/2007 | Hansen | 355/67 |
| 7,512,927 B2* | 3/2009 | Gallatin et al. | 716/51 |
| 2006/0147815 A1 | 7/2006 | Melvin, III | |
| 2008/0127027 A1* | 5/2008 | Gallatin et al. | 716/19 |
| 2010/0030545 A1* | 2/2010 | Uno et al. | 703/13 |
| 2010/0119961 A1* | 5/2010 | Ye et al. | 430/30 |
| 2010/0162197 A1* | 6/2010 | Ye et al. | 716/21 |
| 2011/0063632 A1* | 3/2011 | Klassen et al. | 358/1.9 |
| 2011/0116067 A1* | 5/2011 | Ye et al. | 355/67 |

* cited by examiner

*Primary Examiner* — Helen Rossoshek
(74) *Attorney, Agent, or Firm* — Ding Yu Tan

(57) ABSTRACT

A method optical proximity correction includes the following steps. First, a layout of an integrated circuit with an exposure intensity specification is provided. The integrated circuit includes a plurality of patterns and each pattern has an exposure intensity distribution. Second, a quadratic polynomial equation of each exposure intensity distribution is approximated. Third, a local extreme intensity of each exposure intensity distribution is computed by fitting the quadratic polynomial equation. Fourth, the local extreme intensity is determined whether violating the exposure intensity specification or not. Then, the layout is corrected when the local extreme intensity violates the exposure intensity specification.

10 Claims, 2 Drawing Sheets

METHOD AND COMPUTER-READABLE MEDIUM OF OPTICAL PROXIMITY CORRECTION

BACKGROUND

1. Technical Field

The present invention relates to a method of optical proximity correction (OPC). More particularly, the present invention relates to a precise method of OPC and a computer-readable medium recording the same.

2. Description of the Related Art

In semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer.

As the design pattern of integrated circuit becomes smaller and due to the resolution limit of the optical exposure tool, optical proximity effect will easily occur during the photolithographic process for transferring the photo-mask pattern with higher density. The optical proximity effect will cause defects when transferring the photo-mask pattern, such as right-angled corner rounding, line end shortening, and line width increasing/decreasing. In order to avoid the above-mentioned defects caused by the optical proximity effect, the semiconductor process uses a computer system to perform an optical proximity correction (OPC) method of the integrated circuit layout. The corrected integrated circuit layout is then designed as a photo-mask pattern and is formed on the photo-mask.

To check the effects of OPC, photo-mask patterns with OPC have to be verified based on the prediction of photoresist patterns defined thereby, which is conventionally based on a simulation of the exposure intensity distribution at the photoresist layer. By finding out the local extreme intensity, predicted photoresist patterns are obtained from the distribution. According to the photoresist patterns predicted, further OPC is done to further modify the photo-mask patterns so that the later predicted photoresist patterns are closer to those required by the IC process.

Since the design patterns of integrated circuit may be symmetric or asymmetric, it is not proper to assume that the local extreme intensities of different photo-masks lay on the center of gap or of width of the patterns of photo-mask. If assumption of the local extreme intensity is wrong, it could not produce a precise OPC and the yield of integrated circuit may be decreased.

BRIEF SUMMARY

Accordingly, the present invention is directed to a method of optical proximity correction for precisely correct photo-mask patterns of integrated circuit.

The present invention is also directed to a computer-readable medium encoded with a program for controlling a computer to execute steps of the aforementioned method.

The present invention provides a method optical proximity correction including the following steps. First, a layout of an integrated circuit with an exposure intensity specification is provided. The integrated circuit includes a plurality of patterns and each pattern has an exposure intensity distribution. Second, a quadratic polynomial equation of each exposure intensity distribution is approximated. Third, a local extreme intensity of each exposure intensity distribution is computed by fitting the quadratic polynomial equation. Fourth, the local extreme intensity is determined whether violating the exposure intensity specification or not. Then, the layout is corrected when the local extreme intensity violates the exposure intensity specification.

In an embodiment of present invention, the local extreme intensity includes a local minimum intensity and the exposure intensity specification includes a pinch intensity specification. Further, the step of correcting the layout includes pushing-forth the patterns with the exposure intensity distribution having the local minimum intensity.

In an embodiment of present invention, the local extreme intensity includes a local maximum intensity, and the exposure intensity specification includes a bridge intensity specification. Moreover, the step of correcting the layout includes pulling-back the patterns with the exposure intensity distribution having the local maximum intensity.

The present invention also provides a computer-readable medium encoded with a program for controlling the operation of a computer, the program includes: instructions for causing the computer to receive a layout of an integrated circuit with an exposure intensity specification, wherein the integrated circuit includes a plurality of patterns and each pattern has an exposure intensity distribution; instructions for causing the computer to approximate a quadratic polynomial equation of each exposure intensity distribution; instructions for causing the computer to compute a local extreme intensity of each exposure intensity distribution by fitting the quadratic polynomial equation; instructions for causing the computer to determine whether the local extreme intensity violating the exposure intensity specification; and instructions for causing the computer to correct the layout when the local extreme intensity violates the exposure intensity specification.

In an embodiment of present invention, the local extreme intensity includes a local minimum intensity and the exposure intensity specification includes a pinch intensity specification. Moreover, instructions for causing the computer to correct the layout patterns include instructions for causing the computer to push-forth the layout patterns with the exposure intensity distribution having the local minimum intensity.

In an embodiment of present invention, the local extreme intensity includes a local maximum intensity and the exposure intensity specification includes a bridge intensity specification. Moreover, instructions for causing the computer to correct the layout patterns include instructions for causing the computer to pull-forth the patterns with the exposure intensity distribution having the local maximum intensity.

The invention can precisely and efficiently find out the local extreme intensity of exposure intensity distribution of the layout of the integrated circuit. Therefore, the layout can be corrected accurately for fabricating photo-mask, and then the integrated circuit can be fabricated by using the photo-mask to prevent from pinch and bridge defects.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
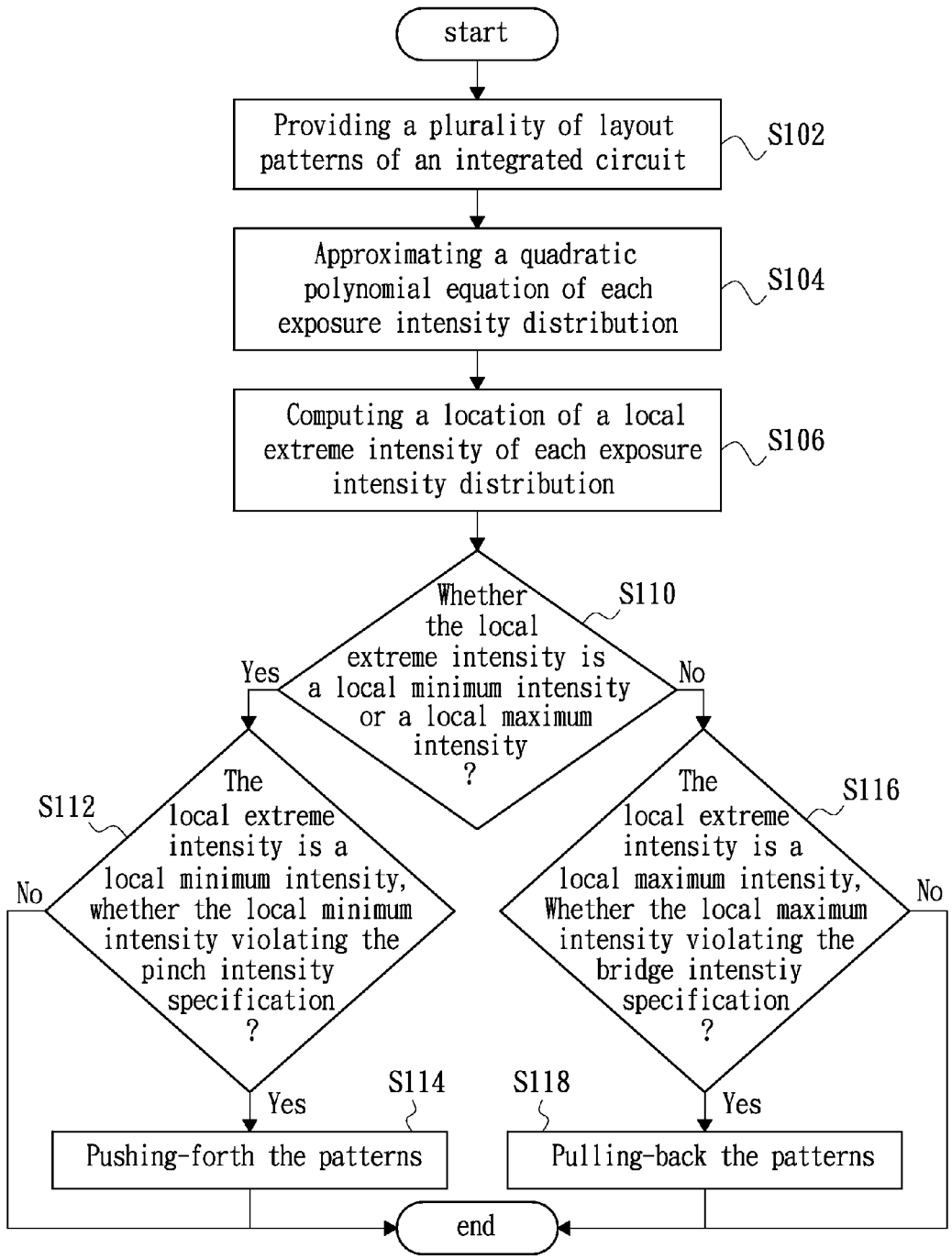
FIG. 1 is a flow chart of a method optical proximate correction according an embodiment of present invention.
Figure 2:
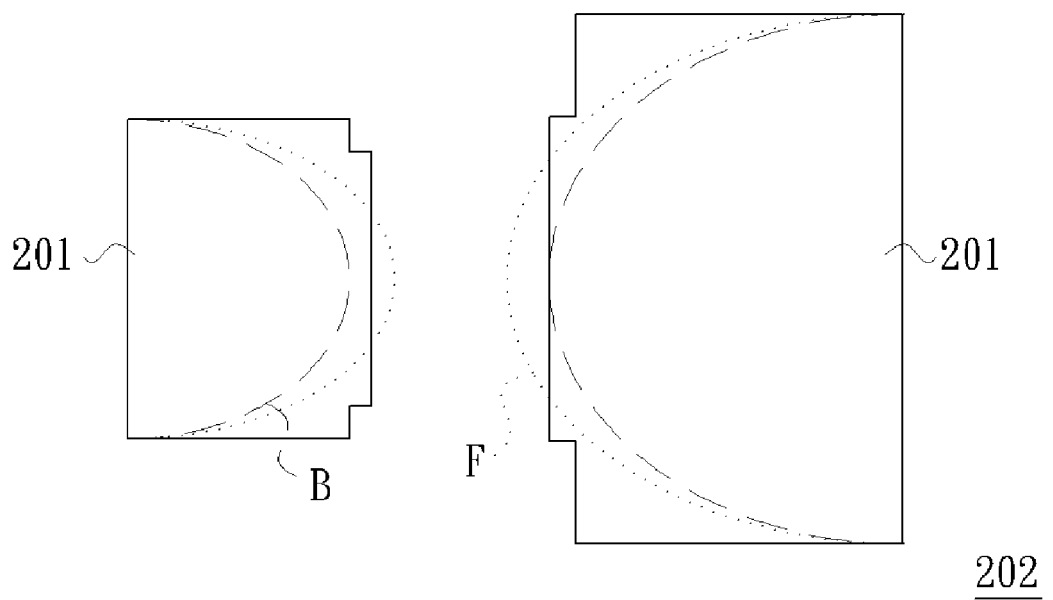
FIG. 2 illustrates a view of layout patterns of an embodiment of present invention.

FIG. 1 is a flow chart of a method optical proximate correction according an embodiment of present invention. FIG. 2 illustrates a view of a layout an integrated circuit of an embodiment of present invention. Referring to FIG. 1 and FIG. 2, in step S102, a layout 202 of an integrated circuit is provided. The integrated circuit includes a plurality of patterns 201 and each pattern 201 has an exposure intensity distribution.

Next, each exposure intensity distribution is assumed that satisfying a quadratic polynomial equation, so that in step S104, the quadratic polynomial equation of each exposure intensity distribution is approximated respectively. For example, one of the exposure intensity distribution is assumed to satisfy a quadratic polynomial equation $f(x)=ax^2+bx+c$ firstly, wherein "a", "b" and "c" are constants. It should be known that those constants of quadratic polynomial equations of different exposure intensity distribution are different. Specifically, three points of the exposure intensity distribution are selected and substituted into the corresponding quadratic polynomial equation. Therefore, the constants "a", "b" and "c" can be obtained, and the quadratic polynomial equation is approximated.

In step S106, a local extreme intensity of each exposure intensity distribution is computed by fitting the quadratic polynomial equation. For example, when differential equation of the quadratic polynomial equation $f(x)=ax^2+bx+c$ is equal to zero, the unknown parameter "x" is equal to $-b/2a$ and the corresponding f(x) is the local extreme intensity. So, "$-b/2a$" is substituted for "x" into the quadratic polynomial equation then the location of the local extreme intensity can be obtained. Further, the local extreme intensity includes local minimum intensity and local maximum intensity. Specifically, if the constant "a" of the quadratic polynomial equation $f(x)=ax^2+bx+c$ is positive, the local extreme intensity of the exposure intensity distribution is a local minimum intensity. On the contrary, if the constant "a" of the quadratic polynomial equation $f(x)=ax^2+bx+c$ is negative, the local extreme intensity of the exposure intensity distribution is a local maximum intensity.

Referring to FIG. 1 and FIG. 2 again, after the local extreme intensity is computed, the local extreme intensity is determined whether violating the exposure intensity specification or not. Specifically, the extreme intensity may be a local minimum intensity or a local maximum intensity, so the local extreme intensity is determined whether be a local minimum intensity or a local maximum intensity after being computed, as described in step S110. Moreover, the exposure intensity specification may include a pinch specification and a bridge specification. Accordingly, if the local extreme intensity is a local minimum intensity, the local minimum intensity is determined whether violating the pinch specification or not, as described in step S112. Then, if the local minimum intensity violates the pinch specification, the layout 202 is corrected by pushing-forth the pattern 201 (as the dotted line F shown in FIG. 2), as described in step S114. Therefore, a photo-mask of the integrated circuit may be made according the corrected layout 202 and be used to fabricate the integrated circuit for preventing from generating pinch defect.

In the contrast, if the local extreme intensity is a local maximum intensity, as described in step S116, the local maximum intensity is determined whether violating the bridge intensity specification. If the local maximum intensity violates the bridge intensity specification, as described in step S118, the process of correcting the layout 202 includes pulling-back the pattern 201 (as the dotted line B shown in FIG. 2). Therefore, the photo-mask made according to the corrected layout 202 can be used to fabricate the integrated circuit for preventing from generating bridge defect.

Furthermore, the method described in this detailed description are programmed and typically stored on a computer-readable storage medium, which may be any type of device or medium that can store code and/or data for use by a computer system. This includes, but is not limited to, magnetic and optical storage devices such as disk drives, flash ROM, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

In summary, the invention can precisely and efficiently find out the local extreme intensity of exposure intensity distribution of layout patterns of integrated circuit even the layout patterns are asymmetric. Therefore, the layout patterns can be corrected accurately for fabricating photo-mask, and then the integrated circuit can be fabricated by using the photo-mask to prevent from pinch and bridge defects.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of optical proximity correction executed by a computer system, comprising:
   providing a layout of an integrated circuit with an exposure intensity specification, wherein the integrated circuit comprising a plurality of patterns, each pattern has an exposure intensity distribution;
   approximating a quadratic polynomial equation of each exposure intensity distribution;
   computing a local extreme intensity of each exposure intensity distribution by fitting the quadratic polynomial equation;
   determining whether the local extreme intensity violating the exposure intensity specification; and
   correcting by the computer system the layout when the local extreme intensity violating the exposure intensity specification.

2. The method of claim 1, wherein the local extreme intensity comprises a local minimum intensity, and the exposure intensity specification comprising a pinch intensity specification, the step of correcting the layout comprises pushing-forth the patterns with the exposure intensity distribution having the local minimum intensity.

3. The method of claim 1, wherein the local extreme intensity comprises a local maximum intensity, and the exposure intensity specification comprising a bridge intensity specification, the step of correcting the layout comprises pulling-back the patterns with the exposure intensity distribution having the local maximum intensity.

4. The method of claim 1, wherein the method of computing the local extreme intensity of each exposure intensity distribution comprises determining whether the local extreme intensity being a local minimum intensity or a local maximum intensity.

5. The method of claim 4, wherein the method of determining the local extreme intensity comprises determining whether the factor of the quadratic term being positive or negative,
- if the factor of the quadratic term being positive, the local extreme intensity being the local minimum intensity; and
- if the factor of the quadratic term being negative, the local extreme intensity being the local maximum intensity.

6. A computer-readable non-transitory medium encoded with a program for controlling the operation of a computer, the program comprising:
- instructions for causing the computer to receive a layout of an integrated circuit with an exposure intensity specification, wherein the integrated circuit comprising a plurality of patterns, each pattern has an exposure intensity distribution;
- instructions for causing the computer to approximate a quadratic polynomial equation of each exposure intensity distribution;
- instructions for causing the computer to compute a local extreme intensity of each exposure intensity distribution by fitting the quadratic polynomial equation;
- instructions for causing the computer to determine whether the local extreme intensity violating the exposure intensity specification; and
- instructions for causing the computer to correct the layout when the local extreme intensity violating the exposure intensity specification.

7. The computer-readable medium of claim 6, wherein the local extreme intensity comprises a local minimum intensity, and the exposure intensity specification comprising a pinch intensity specification, instructions for causing the computer to correct the layout comprises instructions for causing the computer to push-forth the patterns with the exposure intensity distribution having the local minimum intensity.

8. The computer-readable medium of claim 6, wherein the local extreme intensity comprises a local maximum intensity, and the exposure intensity specification comprising a bridge intensity specification, instructions for causing the computer to correct the layout patterns comprises instructions for causing the computer to pull-back the patterns with the exposure intensity distribution having the local maximum intensity.

9. The computer-readable medium of claim 6, wherein the instructions for causing the computer to approximate a quadratic polynomial equation of each exposure intensity distribution comprises instructions for causing the computer to determining whether the local extreme intensity being a local minimum intensity or a local maximum intensity.

10. The computer-readable medium of claim 9, wherein the instructions for causing the computer to determine the local extreme intensity comprises determining whether the factor of the quadratic term being positive or negative,
- if the factor of the quadratic term being positive, the local extreme intensity being the local minimum intensity; and
- if the factor of the quadratic term being negative, the local extreme intensity being the local maximum intensity.

* * * * *